(12) United States Patent
Forey et al.

(10) Patent No.: US 10,622,955 B2
(45) Date of Patent: *Apr. 14, 2020

(54) VARIABLE GAIN AMPLIFIERS FOR COMMUNICATION SYSTEMS

(71) Applicant: INPHI CORPORATION, Santa Clara, CA (US)

(72) Inventors: Simon Forey, Northamptonshire (GB); Rajasekhar Nagulapalli, Northampton (GB); Parmanand Mishra, Cupertino, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/294,834

(22) Filed: Mar. 6, 2019

(65) Prior Publication Data
US 2019/0207576 A1 Jul. 4, 2019

Related U.S. Application Data

(63) Continuation of application No. 15/597,074, filed on May 16, 2017, now Pat. No. 10,270,409.

(51) Int. Cl.
*H03F 3/45* (2006.01)
*H03G 3/22* (2006.01)
*H03G 3/30* (2006.01)
*H03G 1/00* (2006.01)
*H03G 3/00* (2006.01)
*H03G 7/06* (2006.01)

(52) U.S. Cl.
CPC .......... *H03G 3/225* (2013.01); *H03G 1/0005* (2013.01); *H03G 1/0029* (2013.01); *H03G 1/0035* (2013.01); *H03G 1/0088* (2013.01); *H03G 3/001* (2013.01); *H03G 3/3078* (2013.01); *H03G 7/06* (2013.01)

(58) Field of Classification Search
CPC .......... H03G 3/225; H03G 7/06; H03G 3/001; H03G 1/0088; H03G 3/3078; H03G 1/0029; H03G 1/0035; H03G 1/0005
USPC .................. 330/279, 252, 253, 254, 258
See application file for complete search history.

*Primary Examiner* — Khanh V Nguyen
*Assistant Examiner* — Khiem D Nguyen
(74) *Attorney, Agent, or Firm* — Richard T. Ogawa; Ogawa P.C.

(57) ABSTRACT

The present invention is directed to electrical circuits and techniques thereof. In various embodiments, the present invention provides a variable gain amplifier architecture that includes a continuous-time linear equalizer (CTLE) section and a variable gain amplifier (VGA) section. The CTLE section provides both a pair of equalized data signals and a common mode voltage. A DAC generates a control signal based on a control code. The VGA section amplifies the pair of equalized data signals by an amplification factor using a transistor whose resistance value is based on both the common mode voltage and the control signal. There are other embodiments as well.

20 Claims, 7 Drawing Sheets

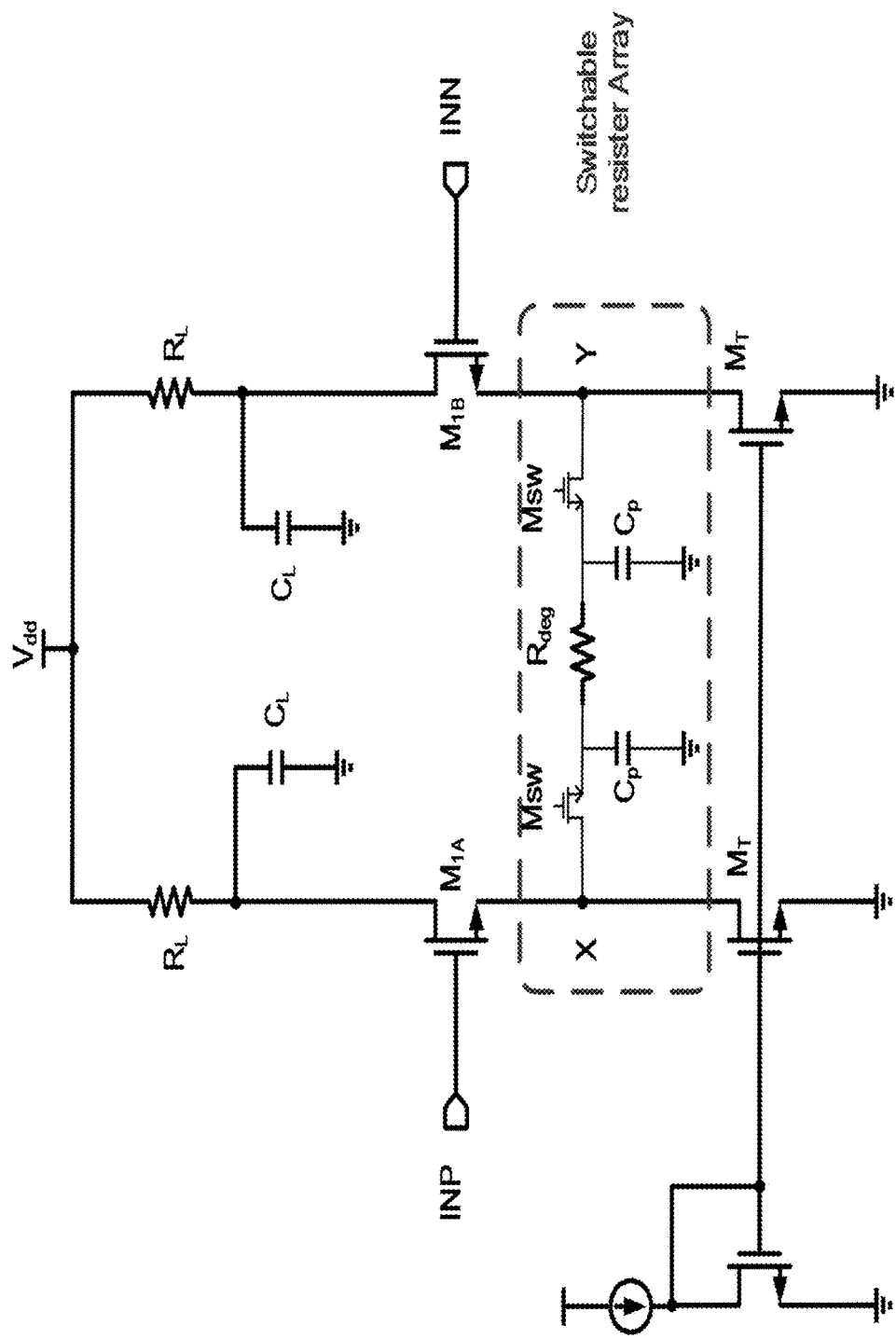
Figure 2A
(Conventional)

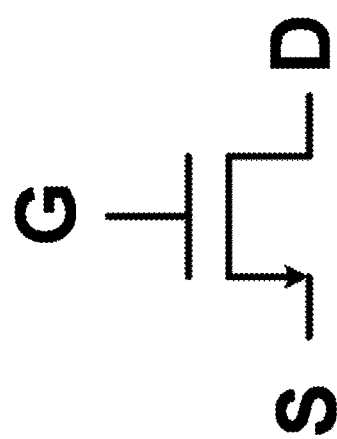

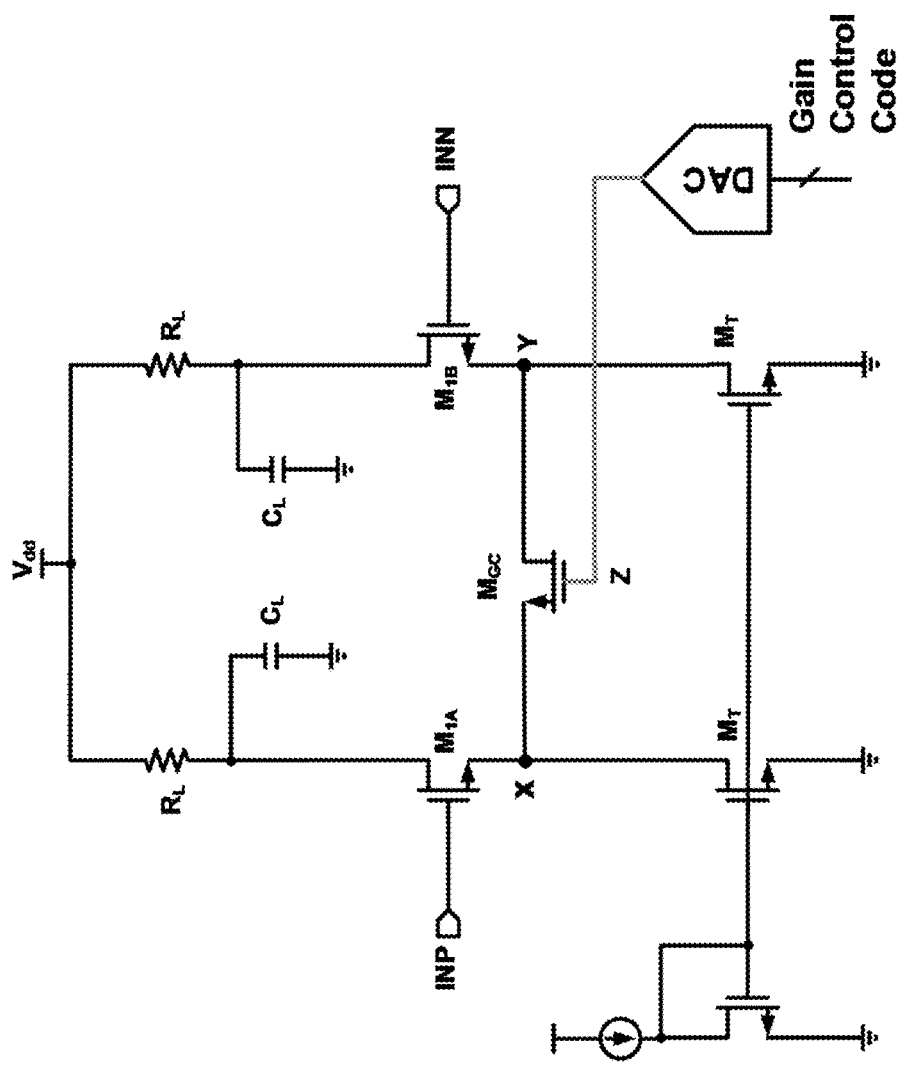
Figure 2C
(Conventional)

VARIABLE GAIN AMPLIFIERS FOR COMMUNICATION SYSTEMS

CROSS-REFERENCES TO RELATED APPLICATIONS

This application is a continuation of U.S. patent application Ser. No. 15/597,074, filed on May 16, 2017, which is hereby incorporated by reference in its entirety.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits and techniques thereof.

A variable gain amplifier (VGA) has many applications. Typically, variable-gain or voltage-controlled amplifier is an electronic amplifier that varies its gain depending on a control voltage (CV)/digital control word. VGAs have many applications, including audio level compression, synthesizers, amplitude modulation, and others. For example, a VGA can be implemented by first creating a voltage-controlled resistor (VCR), which is used to set the amplifier gain. The VCR can be produced by one or more transistors with simple biasing. In certain implementation, VGA are implemented using operational trans-conductance amplifiers (OTA). Sometimes, VGAs are implemented for automatic gain control (AGC) applications. Typically, VGA performance can be measured in terms of gain range, linearity of electrical characteristics, distortion, tunabiltiy, and bandwidth.

Over the past, many types of conventional variable gain amplifiers have been proposed and implemented in different applications. Unfortunately, existing variable gain amplifiers are inadequate, as explained below. It is thus desirable to have new and improved variable gain amplifiers.

BRIEF SUMMARY OF THE INVENTION

The present invention is directed to electrical circuits and techniques thereof. In various embodiments, the present invention provides a variable gain amplifier architecture that includes a continuous-time linear equalizer (CTLE) section and a variable gain amplifier (VGA) section. The CTLE section provides both a pair of equalized data signals and a common mode voltage. A DAC generates a control signal based on a control code. The VGA section amplifies the pair of equalized data signals by an amplification factor using a transistor whose resistance value is based on both the common mode voltage and the control signal. There are other embodiments as well.

According to an embodiment, the present invention provides a variable-gain amplifier device, which includes an equalizer section that has a first transistor and a second transistor. The first transistor has a first gate terminal coupled to a first input signal and a first drain terminal coupled to a first output node. The second transistor has a second gate terminal coupled to a second input signal and a second drain terminal coupled to a second output node. The equalizer section also includes a first common mode resistor coupled to the first output node and a second common mode resistor that is coupled to the second output node and the first common mode resistor. The device includes a digital-to-analog (DAC) configured to generate a control voltage based a gain control code. The device also includes an amplifier section that has a third transistor coupled and a fourth transistor. The third transistor has a gate terminal coupled to the first output node and a third drain node coupled to a third output node. The fourth transistor has a fourth gate terminal coupled to the second output node and a fourth drain terminal coupled to a third output node. The amplifier section also includes a fifth transistor that has a fifth gate terminal coupled to the control voltage and common node between the first common mode resistor and the second common resistor. The fifth transistor is characterized by a resistance value configured between source terminals of the third transistor and the fourth transistor. The resistance value is adjustable using the control voltage applied at the gate terminal.

According to another embodiment, the present invention provides a variable gain amplifier device that has a first transistor and a second transistor. The first transistor has a first gate terminal coupled to a first input signal and a first drain terminal coupled to a first output node. The second transistor has a second gate terminal coupled to a second input signal and a second drain terminal coupled to a second output node. The device also includes a first common mode resistor coupled to the first output node. The device further includes a second common mode resistor coupled to the second output node and the first common mode resistor. The device additionally includes a first load resistor coupled to the first output node. The device also includes a digital-to-analog (DAC) configured to generate a control voltage based a gain control code. The device further includes a third transistor coupled and a fourth transistor. The third transistor has a third gate terminal coupled to the first output node and a third drain node coupled to a third output node. The fourth transistor includes a fourth gate terminal coupled to the second output node and a fourth drain terminal coupled to a third output node. The device further includes a fifth transistor comprising a fifth gate terminal coupled to the control voltage and common node between the first common mode resistor and the second common resistor. The fifth transistor is configured to operate in a triode region and characterized by a resistance value configured between source terminals of the third transistor and the fourth transistor. The resistance value is adjustable using the control voltage.

According to yet another embodiment, the present invention provides a SerDes apparatus that has a data communication interface for receiving a differential input signal with required common mode voltage. The apparatus also includes a loss of signal detection module configured for checking signal presence at the data communication interface. The apparatus also includes a CTLE section configured for providing a common mode voltage and a first equalized signal and a second equalized signal based at least on the first input signal and the second input signal. The apparatus also includes a DAC section configured for generating a control signal based on a control code. The apparatus also includes a VGA section that has a transistor and configured to generate a first amplified signal and a second amplified signal based on the first equalized signal and the second equalized signal. A gain ratio between the first amplified signal and the first equalized signaled is depends on the VGA load and degeneration resistance. The degeneration resistance value is a function of the common mode voltage and the control signal. The apparatus also includes a clock data recovery module being configured to generate a clock signal using at least the first equalize signal and the second equalized signal.

It is to be appreciated that embodiments of the present invention provide many advantages over conventional techniques. Compared to conventional techniques, VGA architecture according to embodiments of the present invention can provide a high level of SNR and tunability, and at the same time low parasitic capacitance at critical nodes.

Embodiments of the present invention can be implemented in conjunction with existing systems and processes. For example, existing communication devices such as SerDes can readily incorporate embodiments of the present invention. VGA architectures according to embodiments of the present invention can take advantage of front end CTLE configurations that are already parts of communication devices. Embodiments of the present invention are compatible with existing manufacturing processes and equipment. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 2A is a simplified diagram illustrating a conventional VGA.

FIG. 2B is a simplified diagram illustrating a triode region transistor that can be used to implement a variable resistor.

FIG. 2C is a diagram illustrating a conventional VGA.

DETAILED DESCRIPTION OF THE INVENTION

The present invention is directed to electrical circuits and techniques thereof. In various embodiments, the present invention provides a variable gain amplifier architecture that includes a continuous-time linear equalizer (CTLE) section and a variable gain amplifier (VGA) section. The CTLE section provides both a pair of equalized data signals and a common mode voltage. A DAC generates a control signal based on a control code. The VGA section amplifies the pair of equalized data signals by an amplification factor using a transistor whose resistance value is based on both the common mode voltage and the control signal. There are other embodiments as well.

As explained above, variable gain amplifiers (VGA) have a wide range of applications. For example, VGAs are often used in communication applications. For example, as a part of a serializer/deserializer (SerDes) system, a VGA can be used to amplify amplitude of received analog signal before other processing techniques (e.g., clock recovery, ADC conversion, etc.) are performed. Depending on actual application and implementation of VGAs, there are various desirable VGA characteristics, such as low noise, small parasitic capacitance on the output nodes, and high linearity.

It is to be appreciated that according to various embodiments of the present invention, VGAs are implemented in conjunction with continuous time linear equalizers. Continuous time linear equalizers are typically included in various types of communication and data processing systems. For example, a SerDes system includes both a transmitter module and a receiver module. Received analog signals, transmitted as a differential pair, are first processed by a continuous-time linear equalizer (CTLE) and then amplified by a VGA. In various embodiments of the presentation invention, VGAs are implemented in conjunction with CTLE. Additionally, one or more digital-to-analog converters (DAC) are used to provide control signal for both the CTLE and the VGA.

Figure 1:
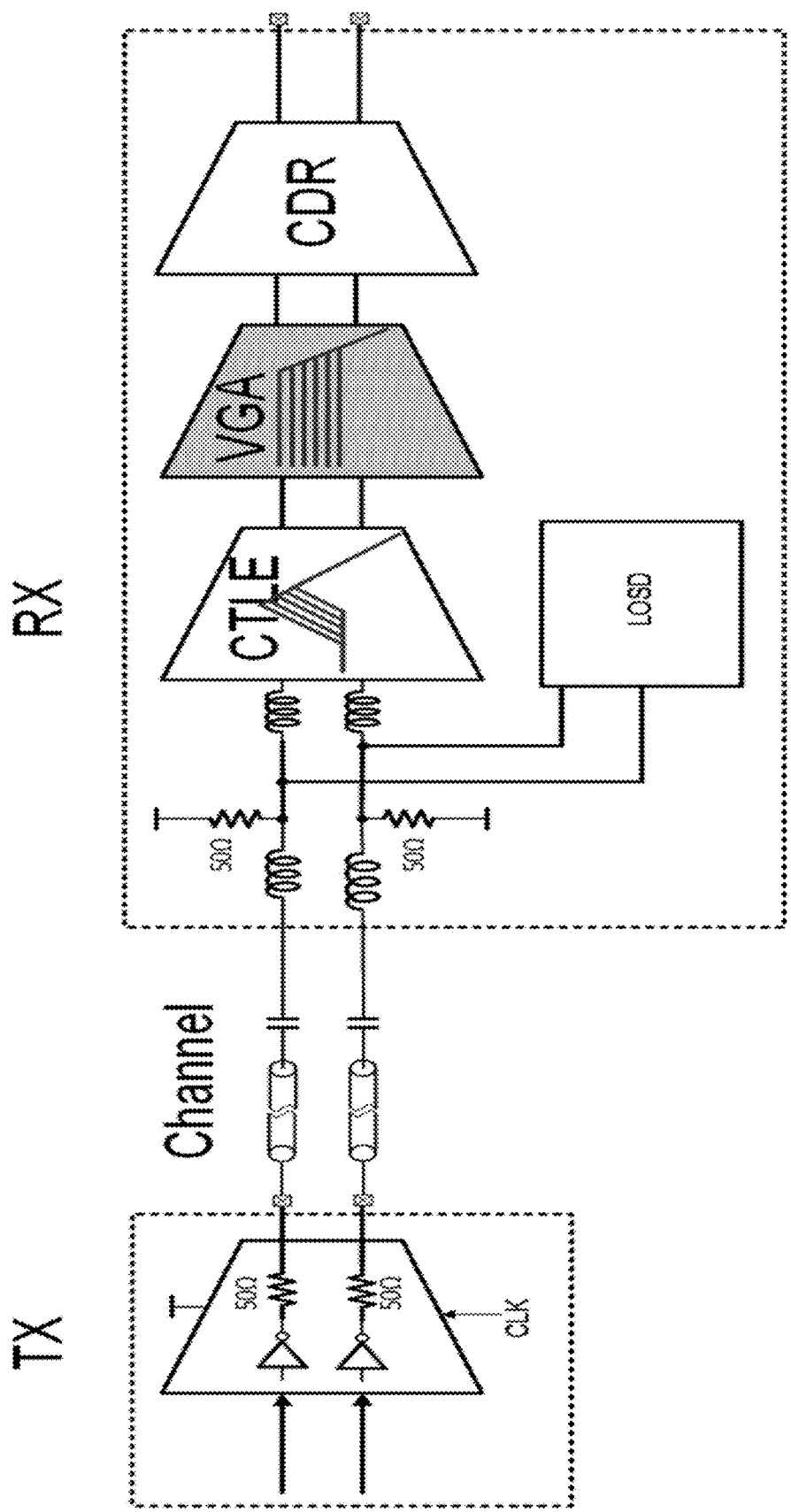
FIG. 1 is a simplified block diagram illustrating a communication system according to embodiments of the present invention.

FIG. 1 is a simplified block diagram illustrating a communication system according to embodiments of the present invention. This diagram is merely an example, which should not unduly limit the scope of the claims. One of ordinary skill in the art would recognize many variations, alternatives, and modifications. In FIG. 1, the transmitter (TX) transits data signal, as a differential signal, to the receiver (RX) via a pair of communication channels. For example, the communication channels can be existing copper wires. At the receiver, the input signals are received at the input terminals with inductor coils and input resistors that improve signal quality. The CTLE module is implemented as a part of the receiver. Input signals are equalized by the CTLE before further processing. For example, loss of signal detection (LOSD) module determines whether there is signal being received. Once it is determined that there are signal coming from the transmitting entity (TX), equalization is performed by the CTLE module. On the other hand, if the LOSD module fails to detect signal presence (or detecting a lack of signal presence), signal processing is not performed. For example, the CTLE module is used as a component of an analog front end portion of the communication device. The equalized signal, which is a differential pair, is then provided to the VGA as show. The VGA is specifically configured to amplify the received signal by a predetermined amount, and the VGA operates in conjunction with CLTE. For example, compared to conventional VGAs implemented with switchable resistor array, VGA implementations according to embodiments of the present invention offer improved performance by taking advantage of the CTLEs. It is to be appreciated that the use of CTLEs with VGAs takes advantage of the fact that CTLEs are essential front end circuit of the receiver devices. For example, receivers are generally implemented with CTLEs followed by one or more VGAs. For example, the VGA is configured to enable constant output voltage swing at the output for a different set of channel lengths by adjusting the gain control code. It is to be appreciated that VGAs according to embodiment of the present invention help maintain linearity. The available signal swing at the output stage can be adjusted using VGAs. For ADC based communication links, automatic gain control often allows for reduced resolution and full-scale range requirement of the ADCs. As mentioned above, VGAs according to the present invention provide high SNR, fine tunability (e.g., 5 to 8 bits), and small parasitic capacitance at the critical nodes.

As shown in FIG. 1, after equalization is performed by the CTLE module and adjusted by the VGA, signal processing such as clock data recovery (CDR), analog to digital conversion (ADC), and/or other processes are then performed. It is to be appreciated that the receiver illustrated in FIG. 1 can be used in a variety of applications and systems. For example, the receiver can be a part of a transceiver device. In various embodiments, receivers are implemented as parts of SerDes system.

As mentioned above, conventional VGAs are often implemented with a switchable resistor array. FIG. 2A is a simplified diagram illustrating a conventional VGA. A conventional VGA includes a pair of input transistors for receiving differential input signals. As shown, input INP is coupled to the gate terminal of transistor $M_{1A}$, and input INN is coupled to the gate terminal of transistor $M_{1B}$. A switchable resistor array section is coupled to the source terminals of transistors $M_{1A}$ and $M_{1B}$. Outputs at the drain terminals of transistors $M_{1A}$ and $M_{1B}$ are coupled to load resistors $R_L$ and load capacitor $C_L$. Supply voltage is provided at terminal $V_{dd}$. Tail current source is provided through transistors $M_T$.

To change the output gain, control signal is applied to the switch transistors $M_{SW}$. Ideally, output gain is linearly proportional to the amplitude of control signal within a large operating frequency range. Unfortunately, the performance of conventional VGA architecture illustrated in FIG. 1 is far from ideal. Among other things, capacitance at node X and Y would limit the frequency response. Additional, this capacitance may cause undesirable phase shift and group delay described be Equation 1 below:

$$\text{Frequency dependent amplifier gain} = \frac{\frac{g_{m1}}{1 + \frac{g_{m1}R_{deg}}{2 + SC_P R_{deg}}} \cdot \frac{R_L}{1 + SC_L R_L}} \quad \text{Equation 1}$$

Depending on the implementation, the parasitic capacitance can increase with number of gain steps and gain range (i.e., depending on the number of switches). More specifically, when increasing number of gain steps, number of switches increases accordingly (e.g., 32 for 5-bits gain control). The increased number of switches introduces a lot of undesirable coupling capacitance in the signal path in the circuit physical layout. The coupling capacitance usually leads to impaired frequency response for the VGA.

In addition to switch resistor array configuration illustrated in FIG. 2A, conventional systems also provide for variable resistor implementation. For example, the switch resistors array illustrated in FIG. 2A can be replaced by one or more variable resistors. FIG. 2B is a simplified diagram illustrating a triode region transistor that can be used to implement a variable resistor. For example, the drain-to-source resistance of the triode region transistor changes continuously with gate voltage change. Even for a wide range of gain variations, a single transistor may be sufficient, thus eliminating the need for having multiple resistors and switches. The reduced number of resistive elements can effectively reduce the undesirable parasitic capacitance associated with switches. For example, the resistance value of the triode region transistor in FIG. 2B can be described by Equation 2 below:

$$R_{ds} = \frac{1}{u_n C_{ox} \frac{W}{L}(V_{gs} - V_{th})} \quad \text{Equation 2}$$

For example, the resistance value $R_{ds}$ can be adjusted by changing the voltage applied to the gate of the triode region transistor. A gain control module is coupled to the triode region transistor and applies the gate voltage accordingly. Unfortunately, the use of triode region transistors in lieu of resistor arrays has its own drawbacks. The gain control transistor needs to operate in triode region during the entire signal swing. Otherwise, the triode region transistor would behave as a current source as opposed to the intended resistor which limits gain and linearity.

FIG. 2C is a diagram illustrating a conventional VGA. Triode region transistor $M_{GC}$ operates as a variable gain resistor, and its resistance value is based its gate voltage at point Z. The gate voltage is provided by a DAC, which coverts gain control code to the gate voltage. As mentioned above, transistor $M_{GC}$ needs to operate in triode region for the VGA to work, and that means the gate voltage at node Z need to be higher than voltage at node X, and the voltage difference should be great than the transistor threshold voltage $V_{th}$. Triode region voltage can be expressed by Equation 3 below:

$$V_Z > V_X + V_{th} \quad \text{Equation 3:}$$

To maintain voltage $V_Z$, the DAC output voltage needs to be maintained. For example, the DAC gain control code can be preprogrammed to avoid voltage $V_Z$ dropping too low. A major drawback for VGA in FIG. 2C is thus the dependence on the DAC output. For example, deviations from the DAC output could cause transistor $M_{GC}$ to enter non-triode mode and result in VGA non-linearity. It is to be appreciated that embodiments of the present invention implement efficient VGA structures with few of the conventional VGA drawbacks.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 3:
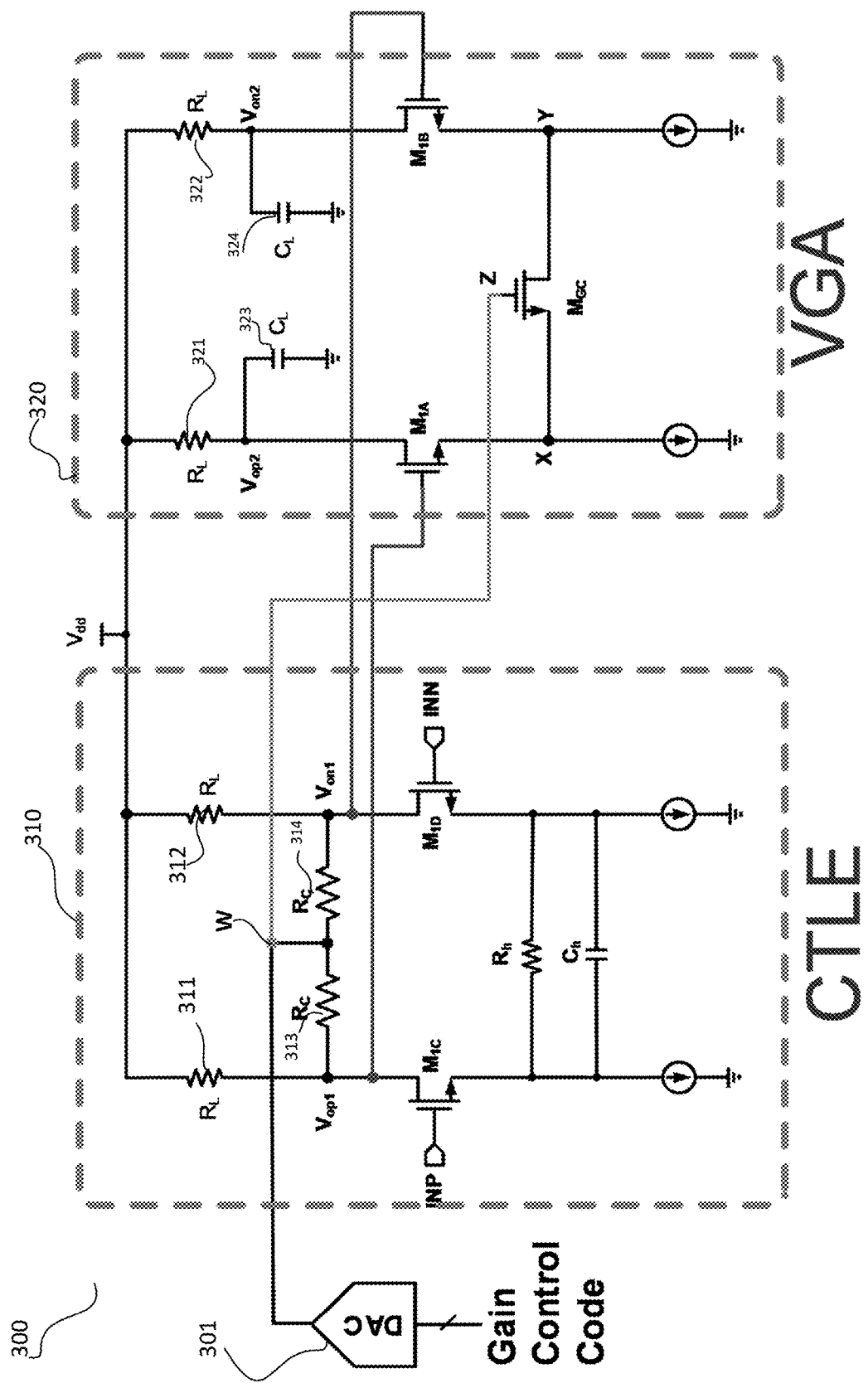
FIG. 3 is a simplified diagram illustrating a VGA according to embodiments of the present invention.

As mentioned above, VGAs according to embodiments of the present invention are implemented in conjunction with CTLEs. FIG. 3 is a simplified diagram illustrating a VGA according to embodiments of the present invention. This diagram is merely an example, which should not unduly limit the scope of the claims. One of ordinary skill in the art would recognize many variations, alternatives, and modifications. As shown, the VGA architecture 300 includes a CTLE section 310 and a VGA section 320. For example, CTLE section 310 and VGA section 320 are both parts of a large device, such as a receiver or a SerDes front end. Among other things, CTLE section 310 provides equalized differential signals that is to be amplified by the VGA section 320. CTLE section 310 additionally provides control signal for transistor $M_{GC}$, which functions as a voltage controlled variable resistor. By injecting controlled amount of current into the CTLE section 310, VGA architecture ensures the adequate gate voltage for transistor $M_{GC}$ which is sufficiently above the threshold voltage keep transistor $M_{GC}$ operating in its triode region.

As shown in FIG. 3, input signals are received by the input transistors at the CTLE section 310. Positive input signal "INP" is provided at the gate of transistor $M_{1C}$, and the negative input signal "INN" is provided at the gate of transistor $M_{1D}$. The source terminals of transistors $M_{1C}$ and $M_{1D}$ are coupled to current sources. CTLE output signals $V_{op1}$ and $V_{on1}$ of the CTLE are provided at the drain terminals of transistors $M_{1C}$ and $M_{1D}$. The drain terminals of transistors $M_{1C}$ and $M_{1D}$ are additionally coupled to load resistors 311 and 312. A pair of common mode resistors 313 and 314 are provided between the two output signals to sense the common mode voltage. CTLE output signals $V_{op1}$ and $V_{on1}$ are provided to the input transistors of VGA section 320. Supply voltage for both CTLE section 310 and VGA section 320 is provided at terminal $V_{dd}$ as shown.

The amplification of the VGA architecture, which determines swing magnitude of output signals $V_{op2}$ and $V_{on2}$, is based on the resistance value (between point X and point Y) of transistor $M_{GC}$. To change the resistance value of transistor $M_{GC}$, the control voltage applied to the gate of transistor $M_{GC}$ (or node Z) is adjusted. The control voltage at node Z is a function of both output of DAC 301 and common node voltage between resistors 313 and 314. The common node voltage between resistors 313 and 314 ensures that a minimum voltage level is provided, as the voltage of control signal provided by DAC 301 is added on top of the common voltage at node W.

Output signals $V_{op1}$ and $V_{on1}$ of CTEL section 310 are equalized signals used as input signals for VGA section 320.

As an example, VGA section 320 is implemented with both differential inputs and differential outputs. Differential inputs are provided at gate terminals of transistors $M_{1A}$ and $M_{1B}$. For example, transistors $M_{1A}$ and $M_{1B}$ are implemented using PMOS devices, but it is to be appreciated that other types of transistor devices are possible as well. Transistors $M_{1A}$ and $M_{1B}$ amplify $V_{op1}$ and $V_{on1}$ received at their respective gate terminals. The amount of amplification largely depends on the resistance between node X and node Y. For example, transistor $M_{GC}$ is a triode region biased in transistor, and it operates as a resister as long as the voltage at node Z is above the threshold voltage $V_{th}$ of transistor $M_{GC}$. The common mode node W, as explained above, can be configured to have a voltage level that is always higher than the threshold voltage of transistor $M_{GC}$. In various embodiments, common mode resistors 313 and 314 are specifically configured to have a much higher resistance value than the load resistors 311 and 312. In various embodiments, at CTLE section 310 the common mode resistor value is at least ten times greater than the load resistor value to avoid loading on the CTLE due to the invention. For example, the resistance of common resistor 314 is around 10KΩ, while the resistance of load resistor 312 is about 150Ω.

In various embodiments, the control voltage from DAC 301 is specifically calibrated relative to the common mode voltage at node W. Digital control codes used as input for DAC 301 are calibrated according to common mode voltage at node W and the threshold voltage of the triode transistor $M_{GC}$. It is to be understood while the threshold voltage of the triode transistor $M_{GC}$ is device specific and stays constant for the device, common mode voltage at node W may change due to different supply voltage at $V_{dd}$ or voltage of input signals. In certain implementations, a control module (not shown in FIG. 3) determines what gain control code to be fed into DAC 301 based on the supply voltage $V_{dd}$ and voltage swing of input signals INP and INN.

Depending on the implementation, the gain control code for the DAC 301 can be set in various ways. For example, a feedback mechanism may be used to determine the common mode voltage at node W, and a control generates gain control accordingly. In various embodiments, swing of input voltage is predetermined to be within a range, and the gain control code is calibrated accordingly. For example, the gain control code may be stored at a lookup table.

At the VGA section 320, output signals are provided at $V_{op2}$ and $V_{op2}$, where the signals received from the CTLE section 310 are amplified by a factor based on the resistance value of transistor $M_{GC}$. At the VGA section 320, output nodes $V_{op2}$ and $V_{on2}$ are also coupled to load resistors and load capacitors. For example, $V_{op2}$ is coupled to load resistor 321 and load capacitor 323; $V_{on2}$ is coupled to load resistor 322 and load capacitor 324. In various implementations, use and arrangement of load resistors and capacitors may be modified.

Figure 4:
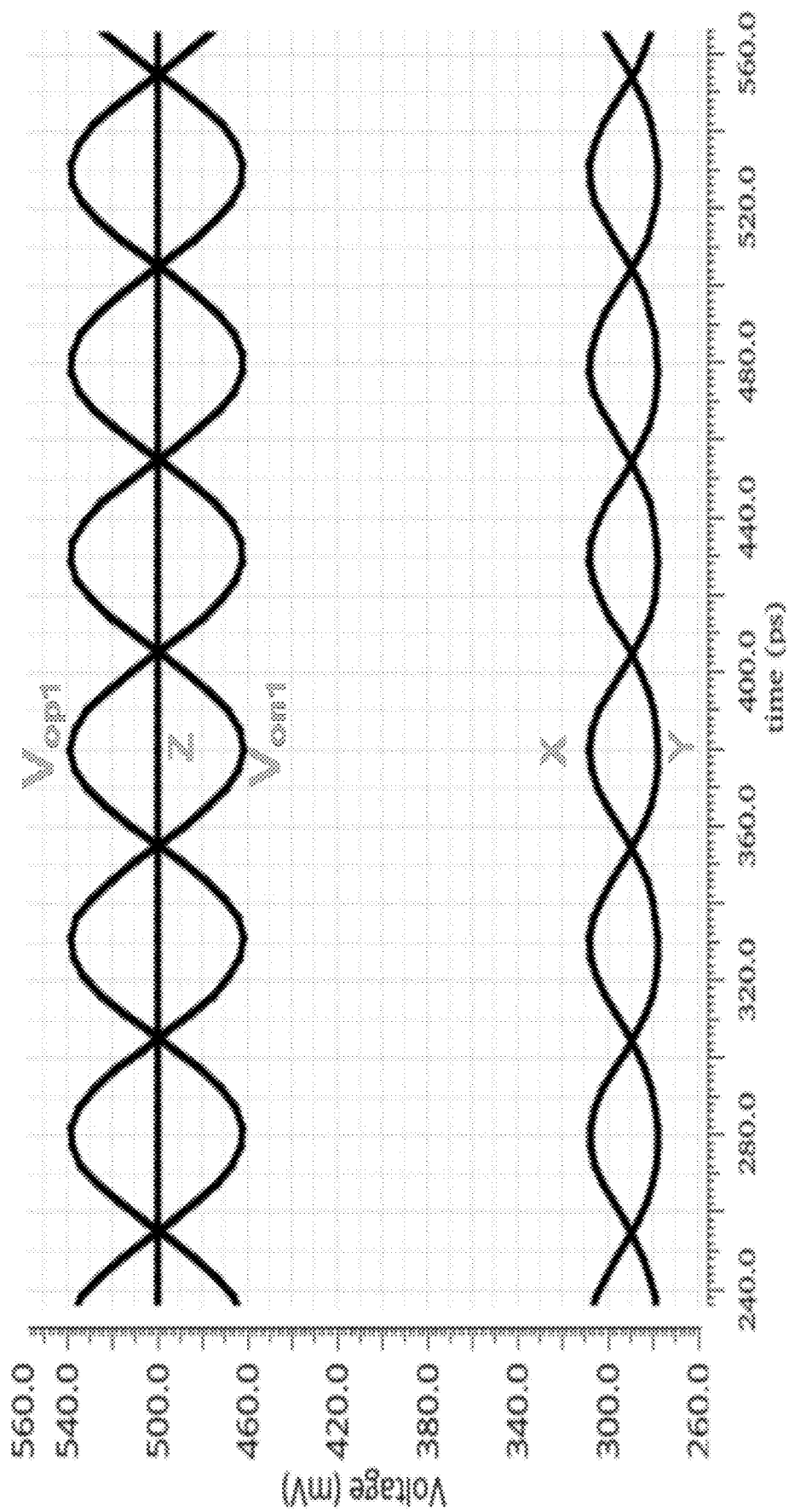
FIG. 4 is a simplified diagram illustrating operation of VGA architecture 300 according to embodiments of the present invention.

FIG. 4 is a simplified diagram illustrating operation of VGA architecture 300 according to embodiments of the present invention. This diagram is merely an example, which should not unduly limit the scope of the claims. One of ordinary skill in the art would recognize many variations, alternatives, and modifications. The voltages of the nodes X, Y, and Z of VGA architecture 300 are shown. For the purpose of illustration, a 10 GHz sine wave differential signal is used as the input signal. The common mode voltage is about 500 mV, which is applied to node Z. The swing voltages of the output signals $V_{op1}$ and $V_{on1}$ around the common mode voltage of about 500 mV. In comparison, signals at nodes X and Y swing around 290 mV. This translates to at least 200 mV $V_{gs}$, the voltage differential between gate voltage and the source/drain voltage, for the transistor $M_{GC}$. The output of the DAC 301 is added to the 200 mV $V_{gs}$, and the 200 mV functions as a buffer that prevents transistor $M_{GC}$ from moving out of its triode region. It is to be appreciated that while the DAC output voltage may change during operation, the common node voltage at the CTLE section 310 provides a buffer voltage that keeps transistor $M_{GC}$ in its triode region.

Figure 5:
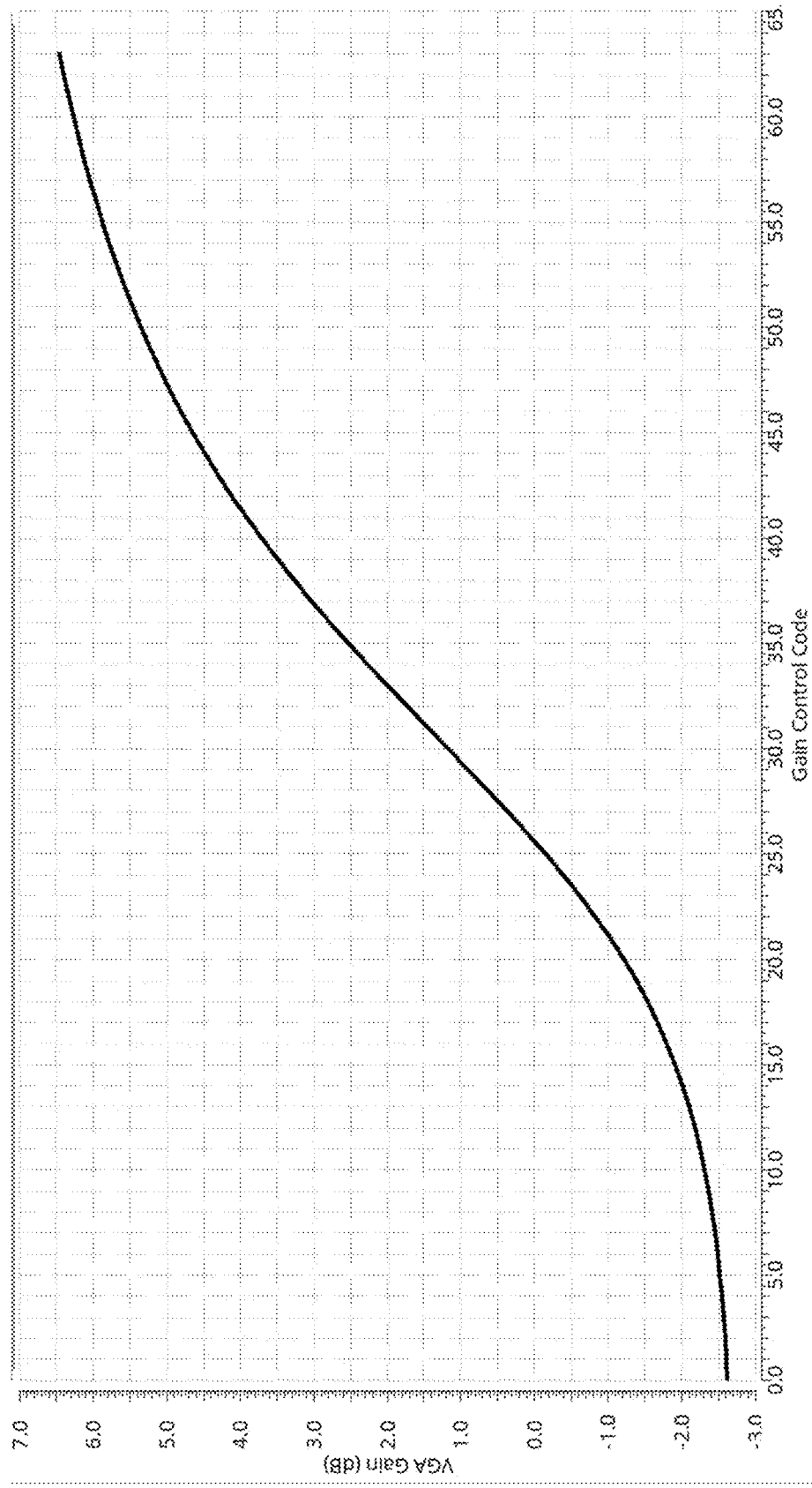
FIG. 5 is a graph illustrating VGA gain in relation to the DAC gain control code according to embodiments of the present invention.

FIG. 5 is a graph illustrating VGA gain in relation to the DAC gain control code according to embodiments of the present invention. This diagram is merely an example, which should not unduly limit the scope of the claims. One of ordinary skill in the art would recognize many variations, alternatives, and modifications. For example, a 6-bits gain control code is used for DAC 301 in FIG. 3. The 6-bits of gain control code translates to 64 steps ($2^6$), as shown in the horizontal axis. The VGA gain for VGA architecture 300 is adjusted from about −2.5 dB to about 6.5 dB. It is to be appreciated that the relationship between the VGA gain and the DAC code is substantially linear over the entire range, and there is no spikes caused by triode region transistors moving in and out of its triode region.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A variable-gain amplifier device comprising:
an equalizer section comprising:
a first transistor and a second transistor, the first transistor comprising a first gate terminal coupled to a first input signal and a first drain terminal coupled to a first output node, the second transistor comprising a second gate terminal coupled to a second input signal and a second drain terminal coupled to a second output node;
a first common mode resistor coupled to the first output node;
a second common mode resistor coupled to the second output node and the first common mode resistor;
a common node configured between the first common mode resistor and the second common mode resistor, the common node is characterized by a common mode voltage;
an amplifier section comprising:
a third transistor and a fourth transistor, the third transistor comprising a third gate terminal coupled to the first output node and a third drain node coupled to a third output node, the fourth transistor comprising a fourth gate terminal coupled to the second output node and a fourth drain terminal coupled to a fourth output node; and
a fifth transistor comprising a fifth gate terminal coupled to a control voltage and the common node between the first common mode resistor and the second common resistor, the fifth transistor being characterized by a resistance value configured between the third transistor and the fourth transistor, the resistance value based on the control voltage and the common node voltage.

2. The device of claim 1 further comprising:
a first load resistor coupled to the first output node;
a second load resistor coupled to the second output node.

3. The device of claim 2 further comprising a current source coupled to a source terminal of the first transistor.

4. The device of claim 2 further comprising a voltage supply coupled to the first load resistor.

5. The device of claim 1 further comprising:
a first load capacitor coupled to the third output node;
a second load capacitor coupled to the fourth output node.

6. The device of claim 1 wherein a sum of a common voltage and the control voltage is greater than a threshold voltage of the fifth transistor.

7. The device of claim 6 wherein the fifth transistor comprises a triode region transistor.

8. The device of claim 6 wherein the threshold voltage is associated with a gate-source voltage differential.

9. The device of claim 1 wherein a gain control code is calibrated based at least on a voltage of the common node.

10. The device of claim 9 further comprising a digital-to-analog (DAC) configured to generate the control voltage based the gain control code.

11. A variable gain amplifier device comprising:
a first transistor and a second transistor, the first transistor comprising a first gate terminal coupled to a first input signal and a first drain terminal coupled to a first output node, the second transistor comprising a second gate terminal coupled to a second input signal and a second drain terminal coupled to a second output node;
a first common mode resistor coupled to the first output node;
a second common mode resistor coupled to the second output node and the first common mode resistor;
a common node configured between the first common mode resistor and the second common mode resistor, the common node is characterized by a common mode voltage;
a third transistor and a fourth transistor, the third transistor comprising a third gate terminal coupled to the first output node and a third drain node coupled to a third output node, the fourth transistor comprising a fourth gate terminal coupled to the second output node and a fourth drain terminal coupled to a fourth output node; and
a fifth transistor comprising a fifth gate terminal coupled to a control voltage and the common node between the first common mode resistor and the second common resistor, the fifth transistor being configured between the third transistor and the fourth resistor, the resistance value based on the control voltage and the common node voltage.

12. The device of claim 11 wherein the first transistor comprises a PMOS transistor.

13. The device of claim 11 wherein the third transistor comprises a PMOS transistor.

14. The device of claim 11 further comprising a digital-to-analog converter (DAC) for generating the control voltage based on a code word.

15. The device of claim 11 wherein the common node voltage is greater than the control voltage.

16. A serializer/deserializer (SerDes) apparatus comprising:
a data communication interface for receiving a first input signal and a second input signal;
a continuous-time linear equalizer (CTLE) section configured for providing a common mode voltage and a first equalized signal and a second equalized signal based at least on the first input signal and the second input signal, the CTLE section comprising a pair of common mode resistors, the common mode voltage being configured between the pair of common mode resistors;

a digital-to-analog (DAC) section configured for generating a control signal based on a control code;

a variable gain amplifier (VGA) section comprising a transistor and configured to generate a first amplified signal and a second amplified signal based on the first equalized signal and the second equalized signal, the VGA section being characterized by a gain ratio being at least based on a degeneration resistance value of the transistor, the degeneration resistance value being a function of the common mode voltage and the control signal; and a clock data recovery module being configured to generate a clock signal using at least the first equalize signal and the second equalized signal.

17. The apparatus of claim 16 further comprising a loss of signal detection module, wherein the clock data recovery module operates in a standby mode if the loss of signal detection module fails to detect signal presence.

18. The apparatus of claim 16 wherein the data communication interface is coupled to a wired communication lane.

19. The apparatus of claim 16 wherein data communication interface is coupled to one or more input inductors.

20. The apparatus of claim 16 wherein the data communication interface is coupled to one or more input resistors.

* * * * *